United States Patent
Son et al.

(10) Patent No.: US 7,724,795 B2
(45) Date of Patent: May 25, 2010

(54) SEMICONDUCTOR OPTOELECTRONIC DEVICE AND METHOD OF FABRICATING THE SAME

(75) Inventors: Joong-kon Son, Yongin-si (KR); Han-youl Ryu, Yongin-si (KR); Tan Sakong, Yongin-si (KR); Ho-sun Paek, Yongin-si (KR); Sung-nam Lee, Yongin-si (KR)

(73) Assignee: Samsung LED Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/878,495

(22) Filed: Jul. 25, 2007

(65) Prior Publication Data

US 2008/0095492 A1 Apr. 24, 2008

(30) Foreign Application Priority Data

Oct. 18, 2006 (KR) .................. 10-2006-0101579

(51) Int. Cl.
*H01S 5/00* (2006.01)
(52) U.S. Cl. ..................... 372/45.01; 385/14
(58) Field of Classification Search ............ 372/43.01, 372/46.01, 75, 50.1, 45.01; 257/13; 385/14
See application file for complete search history.

(56) References Cited

U.S. PATENT DOCUMENTS

| | | | | |
|---|---|---|---|---|
| 5,298,762 A | * | 3/1994 | Ou | 257/13 |
| 5,583,878 A | * | 12/1996 | Shimizu et al. | 372/45.01 |
| 6,744,064 B2 | * | 6/2004 | Lee et al. | 257/13 |
| 6,859,481 B2 | * | 2/2005 | Zheng | 372/70 |
| 7,058,105 B2 | * | 6/2006 | Lee et al. | 372/45.01 |

FOREIGN PATENT DOCUMENTS

| | | |
|---|---|---|
| JP | 10-200216 | 7/1998 |
| KR | 1995-10220 | 4/1995 |
| KR | 10-2004-0034352 | 4/2004 |

OTHER PUBLICATIONS

Korean Office action dated Nov. 20, 2007.
Office Action dated May 20, 2008 for U.S. Appl. No. 11/730,181.

* cited by examiner

*Primary Examiner*—Minsun Harvey
*Assistant Examiner*—Tuan N. Nguyen
(74) *Attorney, Agent, or Firm*—Harness, Dickey & Pierce, P.L.C.

(57) ABSTRACT

Provided is a semiconductor opto-electronic device that may comprise an active layer including a quantum well and a barrier layer on a substrate, upper and lower waveguide layers on and underneath the active layer, respectively, and upper and lower clad layers on and underneath the upper and lower waveguide layers, respectively. The semiconductor opto-electronic device may further comprise an upper optical confinement layer (OCL) between the active layer and the upper waveguide layer and having an energy gap smaller than the energy gap of the upper waveguide layer and equal to or larger than the energy gap of the barrier layer, and a lower OCL between the active layer and the lower waveguide layer and having an energy gap smaller than the energy gap of the lower waveguide layer and equal to or smaller than the energy gap of the barrier layer. Also provided is a method of fabricating the semiconductor opto-electronic device.

31 Claims, 4 Drawing Sheets

SEMICONDUCTOR OPTOELECTRONIC DEVICE AND METHOD OF FABRICATING THE SAME

PRIORITY STATEMENT

This application claims priority under Korean Patent Application No. 2006-0101579, filed on Oct. 18, 2006, in the Korean Intellectual Property Office (KIPO), the entire contents of which are herein incorporated by reference.

BACKGROUND

1. Field

Example embodiments relate to a semiconductor optoelectronic device having higher optical efficiency and method of fabricating the same.

2. Description of the Related Art

A semiconductor laser device is one kind of a nitride-based compound semiconductor opto-electronic device. Such nitride-based light emitting devices use sapphire as the material for forming the substrate. In general, a wave guide layer is formed of GaN to guide light formed in an active layer of the nitride-based laser diode. A clad layer is formed of $Al_xGa_{1-x}N$ to confine light and electrons.

$Al_xGa_{1-x}N$ has a larger energy gap than GaN and a larger refractive index difference from InGaN as an active layer than GaN as a waveguide. An AlGaN layer used as a clad layer has a higher lattice parameter and a higher thermal expansion coefficient than a wave guide layer and GaN used as a n-type contact layer. Thus, cracks are formed. As a result, the composition ratio and the thickness of Al of $Al_xGa_{1-x}N$ are limited. According to recent research results, a composition ratio of Al of an AlGaN/GaN supper lattice is limited to about 14%, and the thickness of Al is confined to 1 μm. A composition ratio of Al of bulk AlGaN is limited to 8%, and the thickness of Al is confined to 1 μm.

An improvement of the optical confinement effect is limited by the thickness of the clad layer and ratio of Al. In other words, the optical confinement factor (OCF) may be reduced, and the threshold current may be increased. Thus, it is difficult to improve the internal quantum efficiency and optical power of a semiconductor opto-electronic device.

SUMMARY

Example embodiments provide a semiconductor opto-electronic device that may be capable of increasing the optical confinement factor (OCF) and reducing internal loss to improve internal quantum efficiency and reliability. In addition, the semiconductor opto-electronic device may have higher efficiency and may be capable of increasing the optical gain to reduce the threshold current of a laser so as to reduce the operation input power.

According to example embodiments, a semiconductor opto-electronic device may comprise an active layer including a quantum well and a barrier layer on a substrate, upper and lower waveguide layers on and underneath the active layer, respectively, and upper and lower clad layers on and underneath the upper and lower waveguide layers, respectively. The semiconductor opto-electronic device may further comprise an upper optical confinement layer (OCL) between the active layer and the upper waveguide layer and having an energy gap smaller than the energy gap of the upper waveguide layer and equal to or larger than the energy gap of the barrier layer, and a lower OCL between the active layer and the lower waveguide layer and having an energy gap smaller than the energy gap of the lower waveguide layer and equal to or smaller than the energy gap of the barrier layer.

According to example embodiments, a method of fabricating a semiconductor opto-electronic device may comprise forming an active layer including a quantum well and a barrier layer on a substrate, forming upper and lower waveguide layers on and underneath the active layer, respectively, and forming upper and lower clad layers on and underneath the upper and lower waveguide layers, respectively. The method of fabricating the semiconductor opto-electronic device may further comprise forming an upper optical confinement layer (OCL) between the active layer and the upper waveguide layer having an energy gap smaller than the energy gap of the upper waveguide layer and equal to or larger than the energy gap of the barrier layer, and forming a lower OCL between the active layer and the lower waveguide layer having an energy gap smaller than the energy gap of the lower waveguide layer and equal to or smaller than the energy gap of the barrier layer.

BRIEF DESCRIPTION OF THE DRAWINGS

Example embodiments will be more clearly understood from the following detailed description taken in conjunction with the accompanying drawings.

FIG. 1 is a cross-sectional view of a semiconductor laser device having a stack structure according to example embodiments;

FIG. 2 is a graph illustrating the energy gap of each crystal layer of the semiconductor laser device illustrated in FIG. 1;

FIG. 3 is a graph illustrating variations of the optical confinement factor (OCF) with respect to increases of 1.5%, 3%, and 4% in a composition ratio of In of the lower optical confinement layer (OCL);

FIG. 4 is a graph illustrating variations of the internal loss with respect to the increases of 1.5%, 3%, 4% in the composition ratio of In of the lower OCL;

FIG. 5 is a graph illustrating variations in the gain threshold value with respect to the increases of 1.5%, 3%, 4% in the composition ratio of In of the lower OCL;

FIG. 6 is a graph illustrating variations and differences in the peak wavelength with respect to variations in the excitation power when the composition ratio of In of the lower OCL is 1.5% and 4%, respectively.

DETAILED DESCRIPTION OF EXAMPLE EMBODIMENTS

Figure 1:
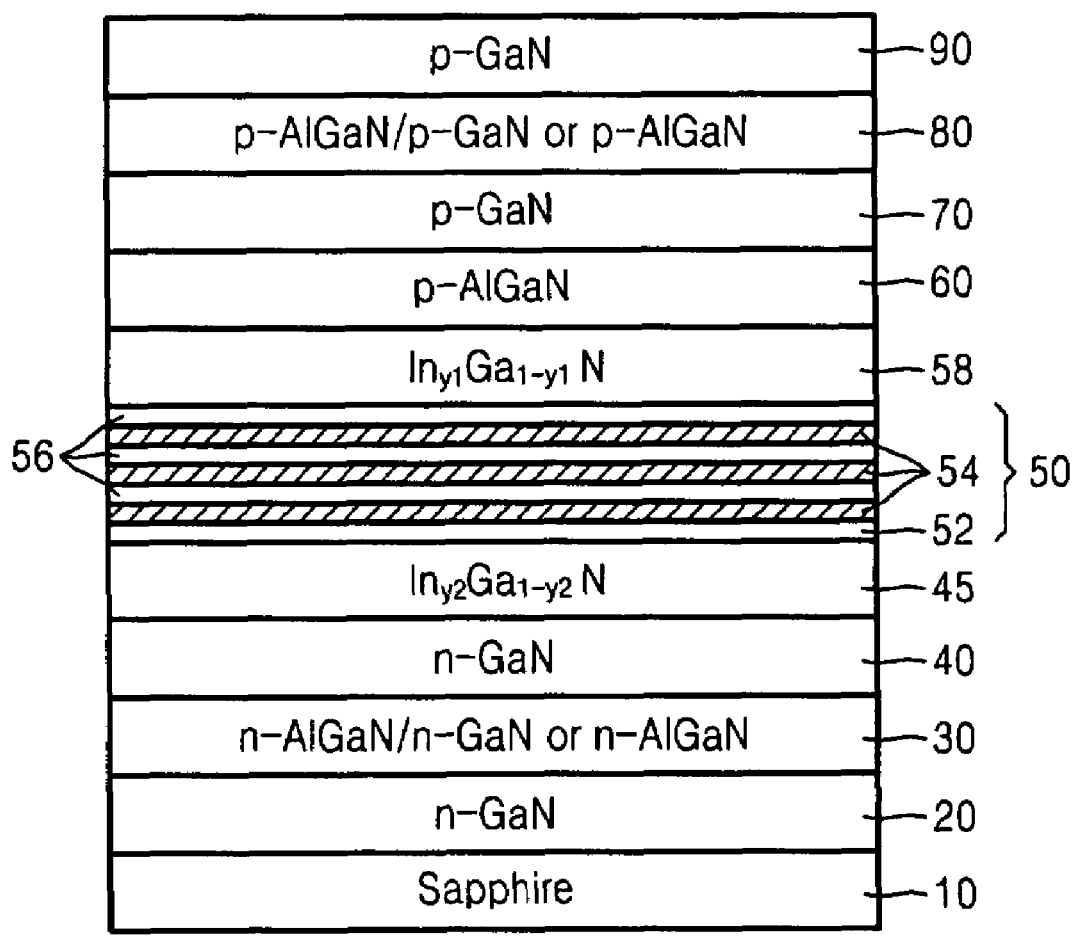
FIGS. 1-6 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor opto-electronic device according to example embodiments may increase the optical confinement factor (OCF) and reduce the internal loss in the structure of a clad layer having a maximum Al composition and no cracks. The semiconductor opto-electronic device may include upper and lower optical confinement layers (OCLs) which may have energy gap values between an active layer, and upper and lower wave guide layers to increase the optical gain. The semiconductor opto-electronic device may have a structure including the upper and lower OCLs. The upper OCL may have an energy gap smaller than the upper wave guide layer and equal to or larger than a barrier layer. The lower OCL may have an energy gap smaller than the lower wave guide layer and equal to or smaller than the barrier layer.

The semiconductor opto-electronic device having the above-described structure may increase internal quantum efficiency and reduce the threshold current and the operation input power, as will be described later. The reductions in the threshold current and the operation input power may contribute to increasing the oscillation efficiency and extending the lifespan of the semiconductor opto-electronic device. In addition, an incorporation ratio of In may be increased, and the strain of a quantum well may be reduced. Thus, a longer wavelength laser having a reduced blue shift may be oscillated.

An effect of the piezoelectric field generated by the strain of the quantum well may be reduced. Thus, a blue shift may be smaller with respect to the excitation power when a semiconductor laser has a wavelength of about 450 nm or more. As a result, a longer wavelength semiconductor laser device may be obtained.

The semiconductor opto-electronic device of example embodiments may be, but not limited to, a nitride-based opto-electronic device that may be used as a light emitting and receiving device.

Figure 2:
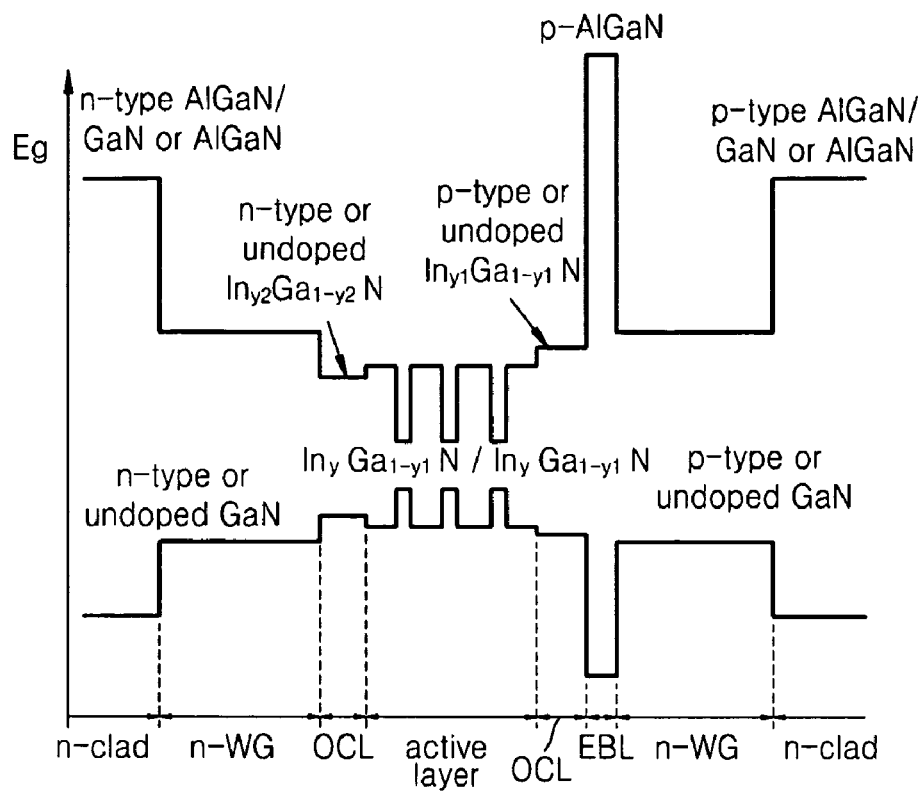

FIG. 1 is a cross-sectional view of a semiconductor laser device having a stack structure according to example embodiments. FIG. 2 is a graph illustrating the energy gap of each crystal layer of the semiconductor laser device illustrated in FIG. 1.

Referring to FIG. 1, a GaN contact layer 20 doped with Si may be formed on a substrate 10 formed of Si, SiC, GaN, sapphire, or etc. An electroluminescent layer including an InGaN active layer 50 as a main element may be formed on the GaN contact layer 20.

The InGaN active layer 50 may include quantum wells 54 formed of $Al_vIn_xGa_{1-x-v}N$ ($0 \leq v$, $x \leq 1$, $0 \leq x+v \leq 1$) and barrier layers 52 and 56 formed of $Al_wIn_yGa_{1-y-w}N$ ($0 \leq w$, $y \leq 1$, $0 \leq y+w \leq 1$). In the InGaN active layer 50, the composition ratio of In of the quantum wells 54 may be equal to or higher than the composition ratio of In of the barrier layers 52 and 56. A composition ratio of Al of the quantum wells 54 may be equal to or lower than the composition ratio of Al of the barrier layers 52 and 56. The InGaN active layer 50 may include multi-quantum wells or a single quantum well.

Lower and upper OCLs 45 and 58 may be asymmetrically formed underneath and on the InGaN active layer 50, respectively. The upper OCL 58 may be formed of $Al_{x1}In_{y1}Ga_{1-x1-y1}N$ ($0 \leq x1$, $y1 \leq 1$, $0 \leq x1+y1 \leq 1$), which may be doped with p-type dopant or may not be doped at all. The lower OCL 45 may be formed of $Al_{x2}In_{y2}Ga_{1-x2-y2}N$ ($0 \leq x2$, $y2 \leq 1$, $0 \leq x2+y2 \leq 1$), which may be doped with a n-type dopant or may not be doped at all.

The composition ratio of In of the lower OCL 45 may be larger than the composition ratio of In of the upper OCL 58 as illustrated in FIG. 2 (e.g., y1<y2). As such, the upper OCL 58 may have an energy gap smaller than the energy gap of the upper waveguide layer 70 and larger than the energy gaps of the barrier layers 52 and 56. The lower OCL 45 may have an energy gap smaller than the lower wave guide layer 40 and equal to or smaller than the energy gaps of the barrier layers 52 and 56.

According to example embodiments, the energy gap of the barrier layer 52 of the InGaN active layer 50, which is closer to the OCL 45, may be smaller than the energy gap of the barrier layers 56. The energy gap of the lower OCL 45 may be equal to the energy gap of the barrier layer 52.

The semiconductor opto-electronic device of example embodiments may further include a buffer layer (not shown) between the lower OCL 45 and a lower wave guide layer 40. The energy gap of the buffer layer may have a value within the range between the energy gap of the lower OCL 45 and the energy gap of the lower wave guide layer 30.

The upper and lower OCLs 58 and 45 of the semiconductor opto-electronic device of example embodiments may be doped with Si or Mg. The upper and lower OCLs 58 and 45 may each have a thickness between approximately 100 Å and 2000 Å.

Upper and lower wave guide layers 70 and 40 may be formed of P-GaN and n-GaN, respectively. Alternatively, the upper and lower wave guide layers 70 and 40 may be formed of p-$Al_zGa_{1-z}N$ ($0 \leq z \leq 0.5$) and n-$Al_zGa_{1-z}N$ ($0 \leq z \leq 0.5$), respectively. The upper and lower wave guide layers 70 and 40 may have larger energy gaps than the upper and lower OCLs 58 and 45. Also, a clad layer 30 and the contact layer 20 may be sequentially formed underneath the lower waveguide layer 40. The clad layer 30 may be formed of n-AlGaN/n-GaN, n-AlGaN/GaN, AlGaN/n-GaN, or n-AlGaN, and the contact layer 20 may be formed of n-GaN. Composition ratios of Al of the upper and lower waveguide layers 70 and 40 must be lower than composition ratios of Al of the upper and lower clad layers 80 and 30.

Figure 3:
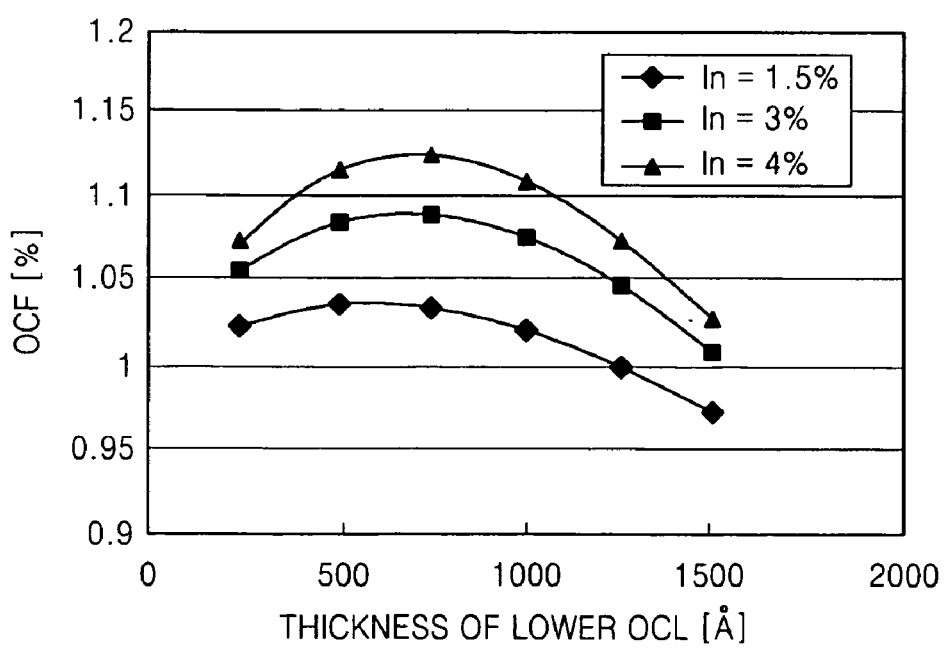

An encapsulated barrier layer (EBL) 60 may be interposed between the upper OCL 58 and the upper waveguide layer 70. The EBL 60 may be formed of p-AlGaN. As illustrated in FIG. 3, the EBL 60 may have the largest energy gap from among the other crystalline layers. Thus, the EBL 60 may reduce or prevent electrons from overflowing and allow holes to pass.

An upper clad layer 80 and an upper contact layer 90 may be sequentially formed on the upper waveguide layer 70. The upper clad layer 80 may be formed of p-AlGaN/p-GaN, p-AlGaN/GaN, AlGaN/p-GaN, or p-AlGaN, and the upper contact layer 90 may be formed of p-GaN.

According to example embodiments in which the upper and lower OCLs 58 and 45 are provided on both sides of the active layer, although the composition of Al and the thickness of the AlGaN clad layer may be limited, the OCF may be increased and internal loss may be reduced. As such, the gain threshold value may be reduced or minimized. As a result, the threshold current and the internal quantum efficiency of the semiconductor opto-electronic device may be improved.

According to example embodiments, a structure including upper and lower waveguide layers 70 and 40 and the upper and lower OCLs 58 and 45 may be used in which the upper and lower OCLs 58 and 45 have upper and lower energy gaps narrower than the energy gaps of the upper and lower waveguide layers 70 and 40. In addition, the upper and lower OCLs 58 and 45 and the upper and lower waveguide layers 70 and 40 may be asymmetric to each other. Thus, a double optical confinement effect and an incorporation ratio of In of the quantum well 54 of the active layer 50 may be improved. In addition, a quantum well may be slightly strained to reduce the blue shift when an oscillation device having a wavelength of about 450 nm or more is fabricated. Thus, a longer wavelength laser may be fabricated.

FIG. 3 is a graph illustrating variations of the OCF with respect to increases of about 1.5%, 3%, and 4% in the composition ratio of In of the lower OCL 45. The composition ratio of In of the upper OCL 58 may be fixed to about 1.5%. As the composition ratio of In of the lower OCL 45 is increased from about 1.5% to 3% and 4%, the OCF may be increased. In other words, when the composition ratios of In of the upper and lower OCLs 58 and 45 are different (e.g., their energy gaps are asymmetric to each other), the OCF may be increased. The OCF may vary according to the thickness of the lower OCL 45 with respect to the composition ratio of In. When the composition of In is about 4%, the OCF may vary the most. This may be because the maximum value of the optical mode becomes closer to the center of the quantum well, QW, due to the increase in In of the lower OCL 45.

Figure 4:
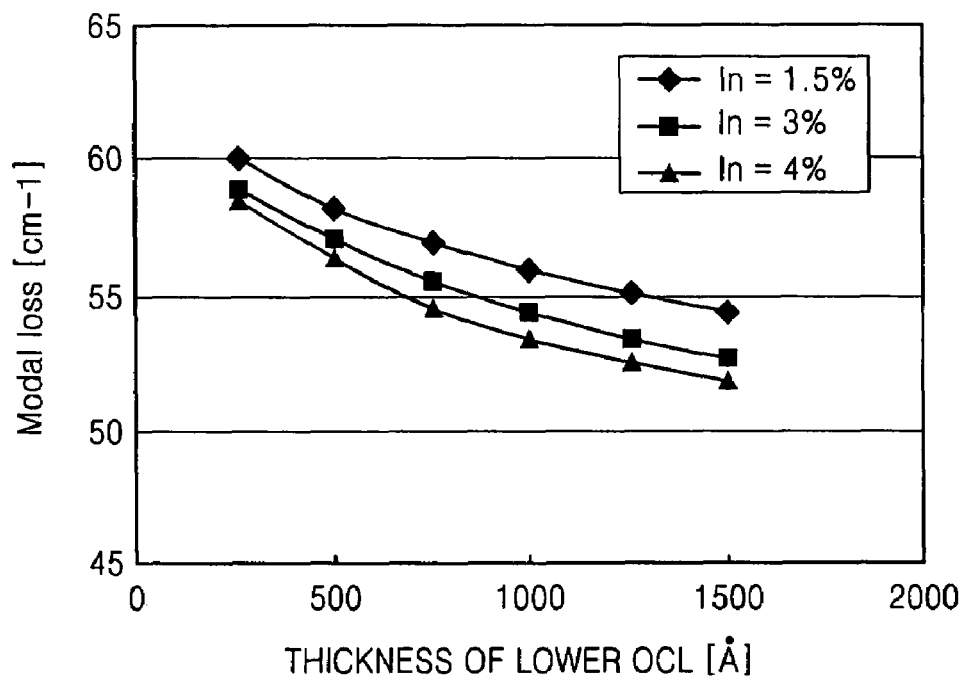

FIG. 4 is a graph illustrating variations in the internal loss, $a_i$, with respect to increases of about 1.5%, 3%, and 4% in the composition ratio of In of the lower OCL 45. The composition ratio of In of the upper OCL 58 may be fixed to about 1.5%. As illustrated in FIG. 4, as the composition ratio of In of the lower OCL 45 is increased from about 1.5% to 3% and 4%, the internal loss may be reduced. In other words, when the composition ratios of In of the upper and lower OCLs 58 and 45 are different (e.g., the energy gaps of the upper and lower OCLs 58 and 45 are asymmetric to each other), the internal loss may be further reduced. This may be interpreted as the phenomenon in which the optical mode inclining toward the p-GaN layer is reduced, and thus internal loss occurring in the p-GaN layer may be reduced.

Figure 5:
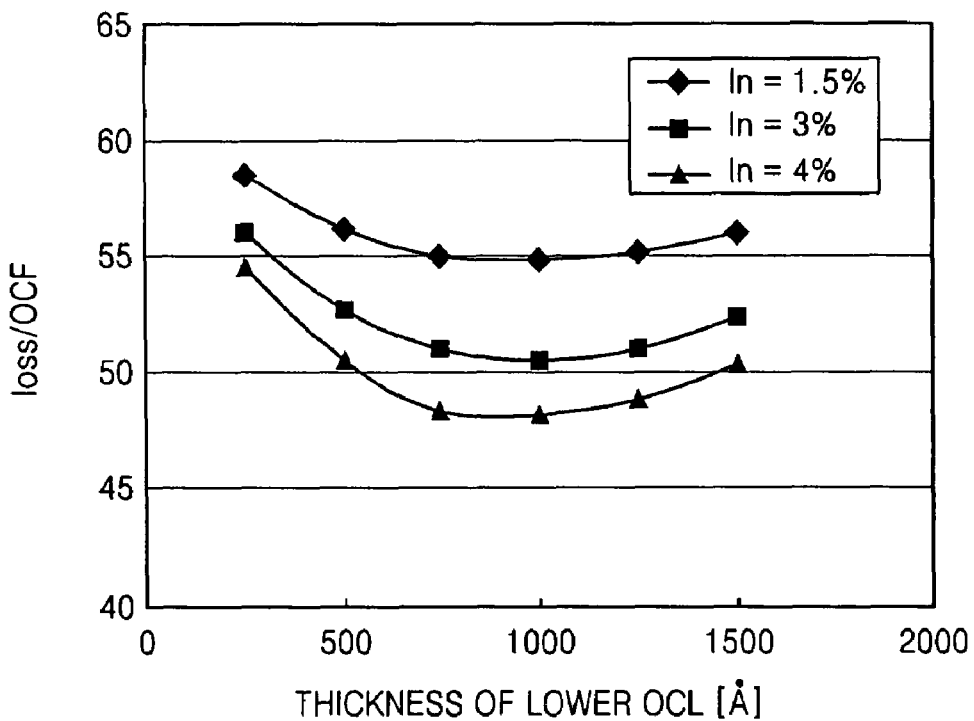

FIG. 5 is a graph illustrating variations in the gain threshold value with respect to increases of about 1.5%, 3%, and 4% in the composition ratio of In of the lower OCL 45. For smaller gain threshold values, the oscillation characteristic of the semiconductor opto-electronic device may be improved. The gain threshold value may be defined as a value obtained by dividing the optical loss by the OCF. When the composition of In of the lower OCL 45 is increased from about 1.5% to 3% and 4% such that the upper and lower OCLs 58 and 45 are asymmetric to each other, the gain threshold value may be lowered.

According to the above results, the thickness of each of the upper and lower OCLs 58 and 45 may be adjusted within the range between approximately 100 Å and 2000 Å. Each of the upper and lower OCLs 58 and 45 may have a thickness between approximately 200 Å and 1200 Å.

Figure 6:
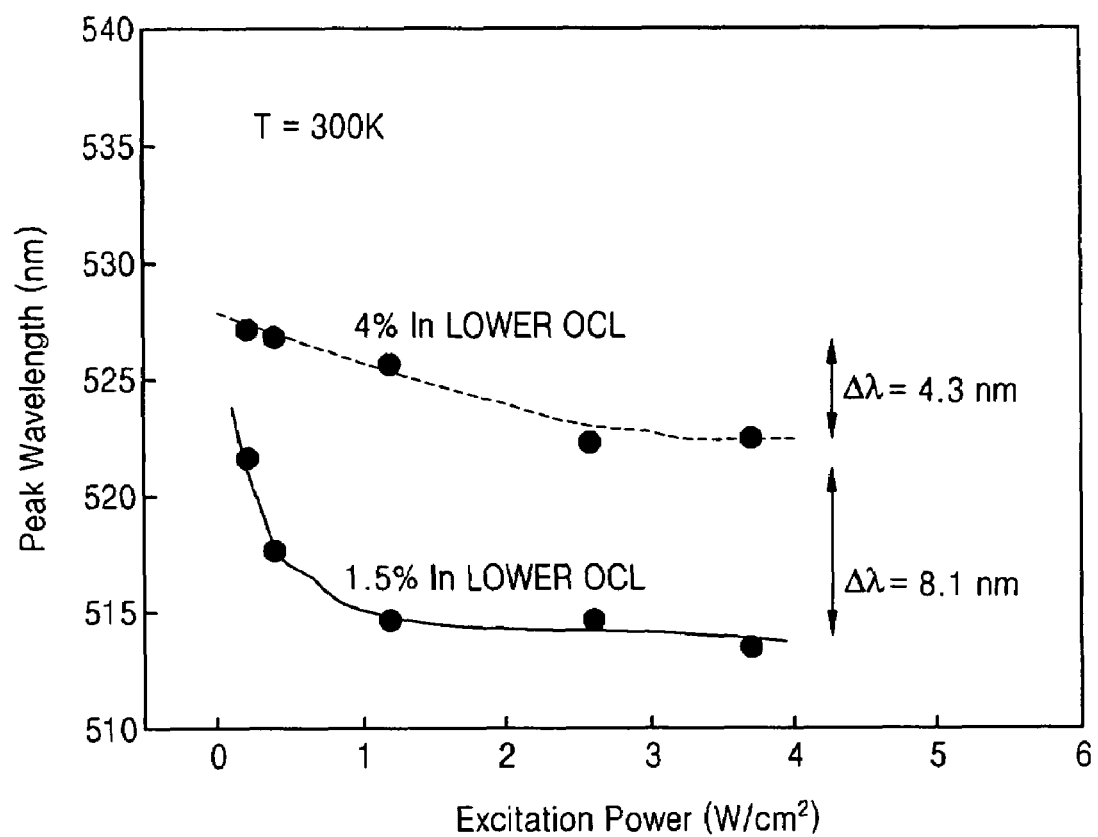

FIG. 6 is a graph illustrating variations and differences in the peak wavelength with respect to variations in the excitation power when the composition ratio of In of the lower OCL 45 are about 1.5% and 4%, respectively. When the composition ratio of In of the lower OCL 45 is about 4%, the optical characteristic of the longer wavelength may be obtained than when the composition ratio of In is about 1.5%. Also, when the composition ratio of In of the lower OCL 45 is about 4%, the excitation power may be increased. Thus, a blue shift ($\Delta\lambda=4.3$ nm) may occur when the composition ratio of In is about 4% and may be about 50% smaller than the blue shift ($\Delta\lambda=8.1$ nm) that may occur when the composition ratio of In is about 1.5%.

As described above, a semiconductor opto-electronic device according to example embodiments may include upper and lower waveguide layers and upper and lower OCLs. The upper and lower OCLs may have energy gaps that may be narrower than the energy gaps of the upper and lower waveguide layers. In addition, the upper and lower OCLs and the upper and lower waveguide layers may be asymmetric to each other. Thus, a double optical confinement effect and the incorporation ratio of In of the quantum well of the active layer may be improved. Further, the effect of the piezoelectric field generated by the strain of the quantum well may be reduced. Thus, a longer wavelength semiconductor laser having a wavelength of about 450 nm or more with a smaller blue shift with respect to the excitation power may be obtained.

The semiconductor opto-electronic device according to example embodiments may be applied to nitride-based light emitting and receiving devices. In other words, the semiconductor opto-electronic device of example embodiments may be applied to white, blue, and green LEDs as nitride-based light emitting devices, ultraviolet, violet, blue, and green LDs, a light receiving device, an electronic device, and etc.

Although example embodiments have been shown and described in this specification and figures, it would be appreciated by those skilled in the art that changes may be made to the illustrated and/or described example embodiments without departing from their principles and spirit.

What is claimed is:

1. A semiconductor opto-electronic device comprising:
   an active layer including at least one quantum well and at least one barrier layer on a substrate;
   upper and lower waveguide layers on and underneath the active layer, respectively;
   upper and lower clad layers on and underneath the upper and lower waveguide layers, respectively;
   an upper OCL (optical confinement layer) between the active layer and the upper waveguide layers and having an energy gap smaller than the energy gap of the upper waveguide layer and equal to or larger than the energy gap of the at least one barrier layer; and
   a lower OCL between the active layer and the lower waveguide layers and having an energy gap smaller than the energy gap of the lower waveguide layer and equal to or smaller than the energy gap of the at least one barrier layer,
   wherein the energy gap of the lower OCL is smaller than the energy gap of the upper OCL.

2. The semiconductor opto-electronic device of claim 1, wherein an electron blocking layer is interposed between the upper waveguide layer and the upper OCL.

3. The semiconductor opto-electronic device of claim 1, wherein the substrate is formed of one of Si, sapphire, SiC, and GaN.

4. The semiconductor opto-electronic device of claim 1, wherein the upper and lower waveguide layers are formed of p-$Al_zGa_{1-z}N$ ($0 \leq z \leq 0.5$) and n-$Al_zGa_{1-z}N$ ($0 \leq z \leq 0.5$), respectively, the upper and lower clad layers are formed of p-AlGaN/p-GaN and n-AlGaN/n-GaN, or p-AlGaN and n-AlGaN, respectively, the at least one quantum well is formed of $Al_vIn_xGa_{1-x-v}N$ ($0 \leq v$, $x \leq 1$, $0 \leq x+v \leq 1$), and the at least one barrier layer is formed of $Al_wIn_yGa_{1-y-w}N$ ($0 \leq w$, $y \leq 1$, $0 \leq y+w \leq 1$, $y \leq x$, $v \leq w$).

5. The semiconductor opto-electronic device of claim 1, wherein the upper OCL is formed of $Al_{x1}In_{y1}Ga_{1-x1-y1}N$ ($0 \leq x1$, $y1 \leq 1$, $0 \leq x1+y1 \leq 1$), the lower OCL is formed of $Al_{x2}In_{y2}Ga_{1-x2-y2}N$ ($0 \leq x2$, $y2 \leq 1$, $0 \leq x2+y2 \leq 1$), and the composition ratio of In of the lower OCL is larger than the composition ratio of In of the upper OCL.

6. The semiconductor opto-electronic device of claim 1, wherein the active layer includes multi-quantum wells.

7. The semiconductor opto-electronic device of claim 6, wherein the active layer comprises a plurality of barrier layers, the energy gap of the barrier layer closest to the lower OCL is smaller than the energy gap of the remaining barrier layers, and the energy gap of the lower OCL is equal to the energy gap of the barrier layer closest to the lower OCL.

8. The semiconductor opto-electronic device of claim 7, further comprising:
   a buffer layer interposed between the lower OCL and the lower waveguide layer, wherein the energy gap of the buffer layer has a value within the range of values of the energy gaps of the lower OCL and the lower waveguide layer.

9. The semiconductor opto-electronic device of claim 7, wherein the upper and lower OCLs are doped with one of Si and Mg.

10. The semiconductor opto-electronic device of claim 7, wherein each of the upper and lower OCLs has a thickness between approximately 100 Å and 2000 Å.

11. The semiconductor opto-electronic device of claim 1, further comprising:
    a buffer layer interposed between the lower OCL and the lower waveguide layer, wherein the energy gap of the buffer layer has a value within the range of values of the energy gaps of the lower OCL and the lower waveguide layer.

12. The semiconductor opto-electronic device of claim 1, wherein the upper and lower OCLs are doped with one of Si and Mg.

13. The semiconductor opto-electronic device of claim 1, wherein each of the upper and lower OCLs has a thickness between approximately 100 Å and 2000 Å.

14. The semiconductor opto-electronic device of claim 1, wherein each of the upper and lower OCLs has a thickness between approximately 200 Å and 1200 Å.

15. The semiconductor opto-electronic device of claim 1, wherein thicknesses of the upper and lower OCLs are different from each other.

16. A method of fabricating a semiconductor opto-electronic device comprising:
    forming an active layer including at least one quantum well and at least one barrier layer on a substrate;
    forming upper and lower waveguide layers on and underneath the active layer, respectively;
    forming upper and lower clad layers on and underneath the upper and lower waveguide layers, respectively;
    forming an upper OCL (optical confinement layer) between the active layer and the upper waveguide layers having an energy gap smaller than the energy gap of the upper waveguide layer and equal to or larger than the energy gap of the at least one barrier layer; and
    forming a lower OCL between the active layer and the lower waveguide layers having an energy gap smaller than the energy gap of the lower waveguide layer and equal to or smaller than the energy gap of the at least one barrier layer,
    wherein the energy gap of the lower OCL is smaller than the energy gap of the upper OCL.

17. The method of fabricating a semiconductor opto-electronic device of claim 16, wherein an electron blocking layer is formed between the upper waveguide layer and the upper OCL.

18. The method of fabricating a semiconductor opto-electronic device of claim 16, wherein the substrate is formed of one of Si, sapphire, SiC, and GaN.

19. The method of fabricating a semiconductor opto-electronic device of claim 16, wherein the upper and lower waveguide layers are formed of p-$Al_zGa_{1-z}N$ ($0 \leq z \leq 0.5$) and n-$Al_zGa_{1-z}N$ ($0 \leq z \leq 0.5$), respectively, the upper and lower clad layers are formed of p-AlGaN/p-GaN and n-AlGaN/n-GaN, or p-AlGaN and n-AlGaN, respectively, the at least one quantum well is formed of $Al_vIn_xGa_{1-x-v}N$ ($0 \leq v$, $x \leq 1$, $0 \leq x+v \leq 1$), and the at least one barrier layer is formed of $Al_wIn_yGa_{1-y-w}N$ ($0 \leq w$, $y \leq 1$, $0 \leq y+w \leq 1$, $y \leq x$, $v \leq w$).

20. The method of fabricating a semiconductor opto-electronic device of claim 16, wherein the upper OCL is formed of $Al_{x1}In_{y1}Ga_{1-x1-y1}N$ ($0 \leq x1$, $y1 \leq 1$, $0 \leq x1+y1 \leq 1$), the lower OCL is formed of $Al_{x2}In_{y2}Ga_{1-x2-y2}N$ ($0 \leq x2$, $y2 \leq 1$, $0 \leq x2+y2 \leq 1$), and the composition ratio of In of the lower OCL is larger than the composition ratio of In of the upper OCL.

21. The method of fabricating a semiconductor opto-electronic device of claim 16, wherein the active layer includes multi-quantum wells.

22. The method of fabricating a semiconductor opto-electronic device of claim 21, wherein the active layer comprises a plurality of barrier layers, the energy gap of the barrier layer closest to the lower OCL is smaller than the energy gap of the remaining barrier layers, and the energy gap of the lower OCL is equal to the energy gap of the barrier layer closest to the lower OCL.

23. The method of fabricating a semiconductor opto-electronic device of claim 22, further comprising:
    forming a buffer layer between the lower OCL and the lower waveguide layer, wherein the energy gap of the buffer layer has a value within the range of values of the energy gaps of the lower OCL and the lower waveguide layer.

24. The method of fabricating a semiconductor opto-electronic device of claim 22, wherein the upper and lower OCLs are doped with one of Si and Mg.

25. The method of fabricating a semiconductor opto-electronic device of claim 22, wherein each of the upper and lower OCLs is formed to a thickness between approximately 100 Å and 2000 Å.

26. The method of fabricating a semiconductor opto-electronic device of claim 16, further comprising:
    forming a buffer layer between the lower OCL and the lower waveguide layer, wherein the energy gap of the buffer layer has a value within the range of values of the energy gaps of the lower OCL and the lower waveguide layer.

27. The method of fabricating a semiconductor opto-electronic device of claim 16, wherein the upper and lower OCLs are doped with one of Si and Mg.

28. The method of fabricating a semiconductor opto-electronic device of claim 16, wherein each of the upper and lower OCLs is formed to a thickness between approximately 100 Å and 2000 Å.

29. The method of fabricating a semiconductor opto-electronic device of claim 16, wherein each of the upper and lower OCLs is formed to a thickness between approximately 200 Å and 1200 Å.

30. The method of fabricating a semiconductor opto-electronic device of claim 16, wherein thicknesses of the upper and lower OCLs are different from each other.

31. A semiconductor optoelectronic device comprising:
    an active layer including at least one quantum well including $Al_vIn_xGa_{1-x-v}N$ ($0 \leq v$, $x \leq 1$, $0 \leq x+v \leq 1$), and at least one barrier layer including $Al_wIn_yGa_{1-y-w}N$ ($0 \leq w$, $y \leq 1$, $0 \leq y+w \leq 1$, $y \leq x$, $y \leq w$) on a substrate;
    upper and lower waveguide layers on and underneath the active layer, respectively;
    upper and lower clad layers on and underneath the upper and lower waveguide layers, respectively;
    an upper OCL (optical confinement layer) including $Al_{x1}In_{y1}Ga_{1-x1-y1}N$ ($0 \leq x1$, $y1 \leq 1$, $0 \leq x1+y1 \leq 1$) between the active layer and the upper waveguide layers and having an energy gap smaller than the energy gap of the upper waveguide layer and equal to or larger than the energy gap of the at least one barrier layer; and
    a lower OCL including $Al_{x2}In_{y2}Ga_{1-x2-y2}N$ ($0 \leq x2$, $y2 \leq 1$, $0 \leq x2+y2 \leq 1$) between the active layer and the lower waveguide layers and having an energy gap smaller than the energy gap of the lower waveguide layer and equal to or smaller than the energy gap of the at least one barrier layer,
    wherein the energy gap of the lower OCL is smaller than the energy gap of the upper OCL.

* * * * *